Dec. 21, 1971 K. KRISTENSEN 3,629,155

ELECTRONIC BISTABLE SEMICONDUCTOR SWITCHING ELEMENT
AND METHOD OF MAKING SAME
Filed Aug. 26, 1969

United States Patent Office 3,629,155
Patented Dec. 21, 1971

3,629,155

ELECTRONIC BISTABLE SEMICONDUCTOR SWITCHING ELEMENT AND METHOD OF MAKING SAME

Knud Kristensen, Nordborg, Denmark, assignor to Danfoss A/S, Nordborg, Denmark

Continuation-in-part of applications, Ser. No. 593,404, and Ser. No. 593,478, both Nov. 10, 1966. This application Aug. 26, 1969, Ser. No. 865,544
Int. Cl. H01b *1/02;* H01l *3/00;* C22c *31/00*
U.S. Cl. 252—512 5 Claims

ABSTRACT OF THE DISCLOSURE

It is found that as the semiconductor composition of an electronic bistable semiconductor switching element there may be employed sulfur or any other solid group VI element, preferably selenium, in admixture with antimony with less rigid control with respect to proportions than is conventional for stibnite switches provided that the composition is used in the form of a layer of a thickness no greater than 1 mm. It is found advantageous to provide the layer on an electrode which is of a highly thermally conductive material and has a cross-sectional area greater than the cross-sectional area of the layer in order to provide a heat sink to aid the dissipation of heat from the layer. A particular application of the invention is a thin-film store. A method is provided for making such a store by providing a film or layer of the semiconductor composition on a unitary electrode and heating the layer to crystallize it uniformly by the application of externally derived heat or by passing a current pulse through it, or by providing a plurality of individual electrodes on the exposed face of the layer and passing a current pulse through the layer between the unitary electrode and the individual electrodes to form crystalline channels in the composition along the paths of said pulses.

Figure 1:
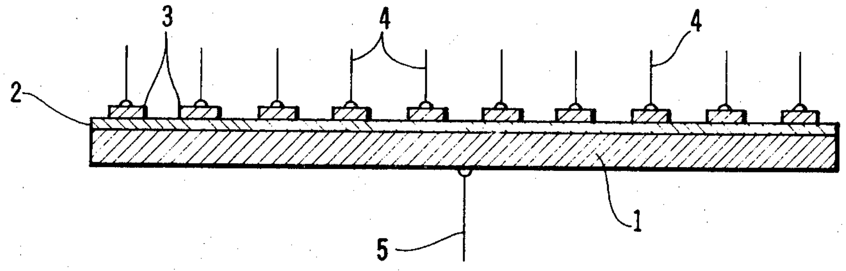

This application is a continuation-in-part of my two previous applications, Ser. No. 593,404 filed Nov. 10, 1966 and Ser. No. 593,478 also filed Nov. 10, 1966 both now abandoned.

This invention relates to an electronic bistable semiconductor switching element comprising a semiconductor composition constituted of antimony in admixture with a solid element of Group VI of the Periodic Table, and to a method of producing it. Preferably, the Group VI element employed is sulfur or selenium and, more preferably, the latter.

It is well known that a stibnite crystal, i.e., a body consisting of antimony and sulphur, can be used as a semiconductor switching element if the antimony component exceeds the stoichiometric ratio of mixture by 1%, and preferably by more than 1.5%. Such a switching element switches from a high-ohmic or high resistance condition of the order of $10^9$ ohm cm. into a low-ohmic or low resistance condition of the order of $10^4$ ohm cm. when charged by a field of more than 1000 v./cm. and switches back again when subjected to heat such as can be produced by an electric pulse. An antimony surplus of at least 1% has always been considered as absolutely necessary because it was believed that the field necessary for switching would otherwise have to be above $10^6$ v./cm., a field strength not available in practice.

Obviously, the need for an accurately maintained antimony surplus is a disadvantage. The manufacturing process becomes very complicated, starting with the exact weighing of the components to be mixed and necessitating the preservation of a constant ratio of mixture in the entire semiconductor element during the whole manufacturing process, in order to guard against the inadvertent absence of such a surplus at a point which, later on, may be situated in the path of the current.

A major object of the present invention is to provide an electronic bistable semiconductor switching element of the above referred to type but which requires less accuracy in the ratio of admixture.

According to the invention, the semiconductor switching element, in the direction in which the field is applied, has a thickness of not more than 1 mm., and preferably not greater than 200 microns.

It is found that in such a semiconductor switching element, it is entirely acceptable that the antimony and the additive be present, in some sections of the current path, substantially according to a stoichiometric mixture ratio. Even in the whole semiconductor switching element the antimony and the additive may be present substantially according to the stoichiometric ratio of admixture. The range falling under the scope of the present invention is meant to cover the entire hitherto excluded range, of an antimony surplus up to about 1% or even a like surplus of an additive. Therefore, a purely stoichiometric ratio of admixture, including such imperfections as cannot be avoided in practice, also falls within the scope of the invention.

The invention is based on the discovery that the switching field strength of more than $10^6$ v./cm. as indicated by the relevant literature for a semiconductor element composed according to the stoichiometric ratio of admixture has been arrived at on the strength of faulty interpretation and must presumably be attributed to a disturbing thermal influence. According to the invention, it is found that by keeping the thickness of the semiconductor element small, no considerable temperature increase takes place with rising field strength and the switching field strength need not be higher than about $4.5 \times 10^4$ v./cm. Since, according to the invention, the semiconductor element is thin, a field of this strength can easily be generated under practical conditions. Moreover, the small thickness of the semiconductor layer has the advantage that the through resistance is low in the low-ohmic condition, a fact known to be favorable for many appications.

According to the invention, there are provided electronic bistable semiconductor switching elements in which there is provided a layer constituted of one of a particular class of semiconductor compositions and having a thickness no greater than 1 mm. and, preferably, no greater than 200 microns. Of course, in the complete switching element there will be at least two conventional electrical connectors, such as leads or contacts, operatively electrically connected to the layer, for example through electrodes, and having the conventional function of enabling the placing of the switch in an electric circuit.

The semiconductor layer of switching elements of the invention may be composed of antimony and sulphur, i.e., stibnite crystal. But it is also possible to provide an element with slightly different properties, composed of antimony and selenium or antimony and chromium, molybdenum, tellurium, tungsten or polonium.

Selenium is particularly preferred instead of sulfur because, other conditions being equal, the switching field strength required with selenium is lower than that required with sulphur. Moreover, the fusing point of selenium (220° C.) is above that of sulphur (1119° C.). This makes the antimony-selenium system more stable and simplifies manufacture, by such conventional techniques as cathode evaporation, due to the lower evaporation pressure required. Antimony and selenium may also be employed according to the stoichiometric ratio of admixture, either approximately or exactly, i.e., with an antimony surplus of less than 1%, if the thickness of the element in the direction in which the field is applied does not exceed 1 mm. and preferably is not greater than 200 microns.

The temperature in a thin element of this kind, i.e., an antimony-selenium system, does not rise with field strength to such an extent that the switching field strength rises disproportionately, as is the case with thicker elements with the same ratio of admixture. Furthermore, the desired switching field strength may be generated by using ordinary voltages, due to the small thickness of the element.

A preferred switch according to the invention functions as a thin-film store. A thin layer or film of semiconductor material is provided on a common unitary electrode, typically of copper or graphite, the exposed face of the layer being in contact with a plurality of individual electrodes. Since the semiconductor material, during the switching operation, can only provide a channel situated below each of the individual electrodes, an integral layer may be used to provide a plurality of individual storage units. The small thickness of the film makes low-power operation and fast read-in and read-out of the stored information possible. By small thickness in this case is intended values of preferably less than 100 microns.

According to a further aspect of the invention, the semiconductor switching element may be provided with an improved heat sink. This may be provided, for example, by employing an electrode of high thermal conductivity, such as of copper, and the cross-sectional area of which is greater than that of the adjacent semiconductor element. Thereby very effective dissipation of heat from the film is provided whereby the film may be of greater thickness.

In a particularly simple manufacturing process according to the invention the semiconductor materials, antimony and the additive, are applied as a layer to the electrode by conventional cathode evaporation and then the semiconductor layer is thermally treated to crystallize it. Such thermal treatment may be effected, for example, by means of passage of a current pulse through the layer of by externally applied heat. A typical suitable current pulse is on the order of one or a few milliamps and for a duration of about 10 to 100 microseconds. A typical suitable application of external heat is to heat the layer at about 200 to 300° C. for a duration of about two minutes.

Preferably, this thermal treatment is effected only in the region of each subsequently required channel because this will leave material of very high resistance outside the channels so that a large number of adjacent channels may be accommodated in a very confined area. To achieve this particularly conveniently, the current pulse effecting thermal treatment may be applied directly through the plurality of individual electrodes. Thereby, beneath each individual electrode an individual channel is provided, extending to the unitary electrode and constituted of the semiconductor composition in crystalline form.

Figure 2:
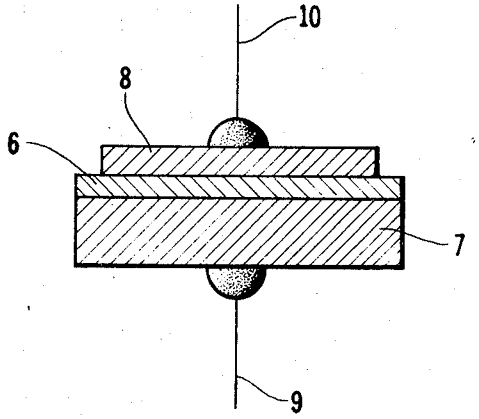

This invention will now be explained in further detail with reference to two embodiments thereof illustrated in the drawings, in which:

FIG. 1 is a cross-sectional view of a thin-film store according to the invention, and FIG. 2 is a cross-sectional view of a semiconductor switching element having flat layers in accordance with the invention.

As seen in FIG. 1, a unitary metal electrode 1 is provided with a film or layer 2 consisting of a substantially stoichiometric mixture of antimony and selenium, produced by cathode evaporation for example. The thickness *d* of the layer 2 is 100 microns. On the layer 2 are provided individual electrodec 3 provided with corresponding leads 4. The electrode 1 is connected to one terminal of a conventional voltage source (not shown). The leads 4 may be selectively connected to the other terminal of the voltage source. The layer 2 is at first amorphous and is later converted into the crystalline condition, in the region beneath each electrode 3, by means of a current pulse, whereby an individual channel is provided beneath each of the electrodes 3.

When one of the leads 4 has been connected to the voltage source, an electric field is set up in the layer 2 beneath the associated electrode 3. As soon as this field exceeds breakdown field strength, switching into the low resistance condition takes place within the channel beneath this electrode 3. This condition is maintained even after the corresponding lead 4 has been disconnected again from the voltage source. However, switching back to the high resistance condition is possible by raising the channel concerned to a higher level of temperature, for example by means of a high current passing through it.

The thin semiconductor element of the invention may also be produced by conventional methods, for example by producing a single crystal from which thin wafers are cut to which the electrodes are then fitted on either side, by fusing a thin layer of the semiconductor composition to the integral or common electrode and then fusing portions of the exposed face of the layer to the individual electrodes, and the like.

In FIG. 2 is shown a thin semiconductor element 6 having a film thickness *d* of 100 microns placed between the electrodes 7, 8 to which leads 9, 10 are attached. The element 6 consists of antimony and selenium approximately according to the stoichiometric ratio of admixture. The switching element of FIG. 2 is essentially a singular switching element of the plurality of switching elements of the thin film store of FIG. 1.

This film is produced by conventional cathode evaporation of antimony and selenium and according to the desired ratio of admixture.

While the invention has been described by reference to particular embodiments thereof, it is to be understood that these embodiments are only illustrative and not restrictive.

What I claim and desire to secure by Letters Patent is:

1. An electronic bistable semiconductor switching element comprising: a pair of electrodes; and a semiconductor layer sandwiched between said pair of electrodes, said semiconductor layer consisting of an admixture of antimony and selenium existing in approximately their stoichiometric ratio, said semiconductor layer having a thickness not greater than 200 microns.

2. A switching element according to claim 1; in which said semiconductor layer has a thickness no greater than 100 microns.

3. An electronic bistable semiconductor switching element comprising: a unitary electrode; a semiconductor layer mounted on said unitary electrode and having an exposed face, said semiconductor layer consisting of an admixture of antimony and a soild element consisting of selenium or sulfur, said admixture existing in approximately a stoichiometric ratio, said semiconductor layer having a thickness not greater than 200 microns; and a plurality of individual electrodes mounted on said exposed face of said semiconductor layer.

4. A switching element according to claim 3; in which said semiconductor layer has a thickness no greater than 100 microns.

5. A switching element according to claim 3; in which said unitary electrode is constituted of a highly thermally conductive material and has a larger cross-sectional area than the cross-sectional area of said semiconductor layer to effectively dissipate heat from said semiconductor layer during operation of the switching element.

References Cited

UNITED STATES PATENTS

| | | | |
|---|---|---|---|
| 2,953,616 | 9/1960 | Pessel et al. | 75—149 |
| 3,343,004 | 9/1967 | Ovshinsky | 307—88.5 |
| 3,271,591 | 9/1966 | Ovshinsky | 307—88.5 |

OTHER REFERENCES

Hansen, Constitution of Binary Alloys (1958), pp. 1172–3.

DOUGLAS S. DRUMMOND, Primary Examiner

U.S. Cl. X.R.

317—237; 307—299; 75—149